(12) United States Patent
Chen et al.

(10) Patent No.: US 8,773,932 B2
(45) Date of Patent: Jul. 8, 2014

(54) BUILT-IN SELF-TEST CIRCUIT APPLIED TO HIGH SPEED I/O PORT

(71) Applicant: MStar Semiconductor, Inc., Hsinchu Hsien (TW)

(72) Inventors: Yu-Lin Chen, Hsinchu Hsien (TW); Hsian-Feng Liu, Hsinchu Hsien (TW); Chung-Ching Chen, Hsinchu Hsien (TW)

(73) Assignee: MStar Semiconductor, Inc., Hsinchu Hsien (TW)

( * ) Notice: Subject to any disclaimer, the term of this patent is extended or adjusted under 35 U.S.C. 154(b) by 0 days.

(21) Appl. No.: 13/756,662

(22) Filed: Feb. 1, 2013

(65) Prior Publication Data

US 2013/0194876 A1    Aug. 1, 2013

(30) Foreign Application Priority Data

Feb. 1, 2012  (TW) .............................. 101103305 A

(51) Int. Cl.
| G11C 7/10 | (2006.01) |
| G11C 7/12 | (2006.01) |
| G11C 7/22 | (2006.01) |
| G11C 8/18 | (2006.01) |
| G11C 29/12 | (2006.01) |
| G11C 29/02 | (2006.01) |

(52) U.S. Cl.
CPC ........ *G11C 29/12* (2013.01); *G11C 7/10* (2013.01); *G11C 7/222* (2013.01); *G11C 7/22* (2013.01); *G11C 29/023* (2013.01)
USPC ....... 365/201; 365/189.02; 365/191; 365/194

(58) Field of Classification Search
CPC .......... G11C 29/12; G11C 7/10; G11C 7/222; G11C 7/22; G11C 29/023
USPC .............................. 365/189.02, 191, 194, 201
See application file for complete search history.

(56) References Cited

U.S. PATENT DOCUMENTS 5,430,684 A *  7/1995  Kim et al. ................. 365/230.01
6,490,641 B2 * 12/2002  Whetsel ........................ 710/104

* cited by examiner

*Primary Examiner* — Ly D Pham
(74) *Attorney, Agent, or Firm* — Edell, Shapiro & Finnan, LLC

(57) ABSTRACT

A built-in self-test circuit (BIST) applied to a high speed I/O port is provided. The BIST circuit includes a detecting unit, a flag unit and a selecting unit. The detecting unit has a first input terminal for receiving a serial output signal, a second input terminal for receiving a serial enable signal, and an output terminal for generating a detection signal. The flag unit receives the detection signal and generates a flag signal. The selecting unit receives the serial output signal, the serial enable signal and the flag signal. When a reset signal is at a first level, the selecting unit transmits the serial output signal and the serial enable signal to the I/O port. When the reset signal is at a second level, the serial output signal and the serial enable signal possesses a predetermined relationship.

13 Claims, 3 Drawing Sheets

BUILT-IN SELF-TEST CIRCUIT APPLIED TO HIGH SPEED I/O PORT

This application claims the benefit of Taiwan application Serial No. 101103305, filed Feb. 1, 2012, the disclosure of which is incorporated by reference herein in its entirety.

BACKGROUND

1. Technical Field

The disclosure relates in general to a built-in self-test (BIST) circuit, and more particularly to a BIST circuit for a high speed I/O port.

2. Description of the Related Art

The transmission speed of memories is ever-increasing, with a speed of an I/O port of a double-data-rate (DDR) memory already reaching a level in GHz. Similarly, it is necessary that a speed level of an I/O port of a DDR memory controller requires a GHz level in order to match with the DDR memory.

FIG. 1 shows a circuit diagram of a conventional memory controller 100 with an I/O port 150. The memory controller 100 includes a core circuit 110 and the I/O port 150. The core circuit 110 includes a control unit 160, an N-to-1 output signal parallel-to-serial converter 120, an N-to-1 enable signal parallel-to-serial converter 130. The I/O port 150 includes an output driver 154, an I/O pad 156 and an input driver 152.

An operating speed of the control unit 160 in the core circuit 110 is lower than that of the I/O port 150. Hence, a parallel output signal Out_P of the control unit 160 is first converted to a serial output signal Out_S, followed by increasing a data speed of the serial output signal Out_S. The serial output signal Out_S with an increased data speed is then outputted to the I/O port 156. Meanwhile, the control unit 160 converts a parallel enable signal En_P to a serial enable signal En_S. The serial enable signal En_S with an increased data speed is then transmitted to the I/O port 150.

The N-to-1 output signal parallel-to-serial converter 120 and the N-to-1 enable signal parallel-to-serial converter 130 are structurally identical circuits. The N-to-1 output signal parallel-to-serial converter 120 receives a clock signal CLK and an N-bit parallel output signal Out_P, and outputs an N-bit serial output signal Out_S in a clock cycle. Similarly, the N-to-1 enable signal parallel-to-serial converter 130 receives the clock signal CLK and an N-bit parallel enable signal En_P, and outputs an N-bit serial enable signal En_S in a clock cycle. For example, N is 4, 8 or another number.

The output driver 154 of the I/O port 150 has an input terminal, and an enable terminal EN for receiving the serial output signal Out_S and serial enable signal En_S, respectively. By asserting the serial enable signal En_S, the output driver 154 transmits the serial output signal Out_S to the I/O pad 156. An input terminal of the input driver 152, connected to the I/O pad 156, then transmits the serial output signal Out_S into the memory controller 100.

When the serial enable signal En_S is at a high level, the I/O pad 156 is tri-stated. When the serial enable signal En_S is at a low level, the I/O pad 156 outputs the serial output signal Out_S. For example, the serial output signal Out_S is a data signal, a command signal or an address signal of the memory controller 100.

The I/O port 150 is a bi-directional I/O port capable of generating an output signal and receiving an input signal. When the I/O port 150 in FIG. 1 lacks the input driver 152, the I/O port 150 serves as a one-directional I/O port capable of only generating an output signal.

Conventionally, an integrated circuit is tested when a manufacturing process of the integrated circuit is complete. An integrated circuit manufacturer usually provides a test pattern to a tester, which then feeds the test pattern into the integrated circuit under test, and determines whether the integrated circuit is defective according to an output signal of an I/O port of the integrated circuit. An integrated circuit passing the test can naturally be delivered to a downstream manufacturer. Conversely, an integrated circuit that fails the test should be discarded.

In order to test an integrated circuit having an I/O port in a GHz level, a speed of a tester needs to be correspondingly increased to the GHz level. However, most of the testers have an operating speed of approximately 100 MHz, which is incapable of carrying out a high speed test for a high performance integrated circuit.

SUMMARY

The disclosure is directed to a built-in self-test (BIST) circuit applied to a high speed I/O port. Through the BIST circuit, a test result is generated at the I/O port as a stable logic signal, so that a low speed tester is able to detect the test result.

The disclosure provides a BIST circuit applied in a memory controller. The memory controller includes a core circuit and an I/O port. The core circuit outputs a reset signal, a serial output signal and a serial enable signal. The I/O port includes an output driver. The BIST circuit includes: a detecting unit, having a first input terminal for receiving the serial output signal, a second input terminal for receiving the serial enable signal, and an output terminal for generating a detection signal; a flag unit, for receiving the detection signal and generating a flag signal; and a selecting unit, for receiving the serial output signal, the serial enable signal and the flag signal. When a reset signal is at a first level, the selecting unit transmits the serial output signal and the serial enable signal to an input terminal and an enable terminal of the output driver, respectively. When the reset signal is at a second level, the serial output signal and the serial enable signal possesses a predetermined relationship. Before the predetermined relationship is present, the detecting unit sets the flag signal in the flag unit so that the selecting unit transmits the flag signal to the input terminal and the enable terminal of the output driver.

The disclosure further provides a BIST circuit applied to a memory controller. The memory controller includes a core circuit, a first I/O port and a second I/O port. The core circuit outputs a reset signal, a first output signal and a second output signal. The first I/O port receives the first output signal and outputs the first output signal. The second I/O port receives the second output signal and receives the second output signal. The BIST circuit includes: a detecting unit, having a first input terminal connected to the first I/O port to receive the first output signal, a second input terminal connected to the second I/O port to receive the second output signal, and an output terminal for generating a detection signal; and a flag unit, for receiving the detection signal and generating a flag signal. When the reset signal is at a first level, the flag signal is cleared. When the reset signal is at a second level, the firs output signal and the second output signal possesses a predetermined relationship. Before the predetermined relationship is established, the detecting unit sets the flag signal in the flag unit.

The above and other aspects of the invention will become better understood with regard to the following detailed description of the preferred but non-limiting embodiments. The following description is made with reference to the accompanying drawings.

In the following detailed description, numerous specific details are set forth in order to provide a thorough understanding of the disclosed embodiments.

DETAILED DESCRIPTION

Figure 1:
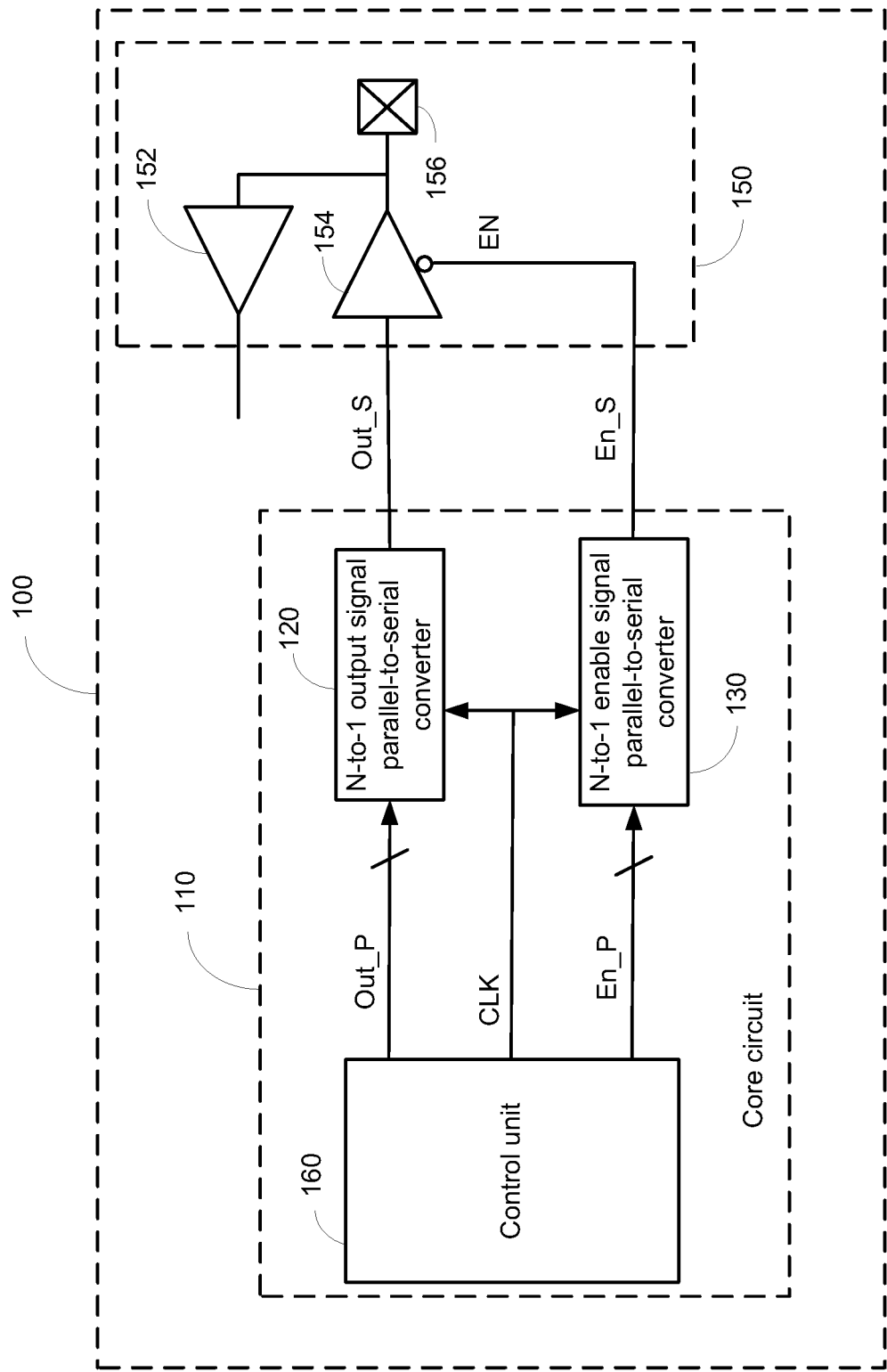
FIG. 1 is an I/O port and associated circuit in a conventional memory controller.
Figure 2:
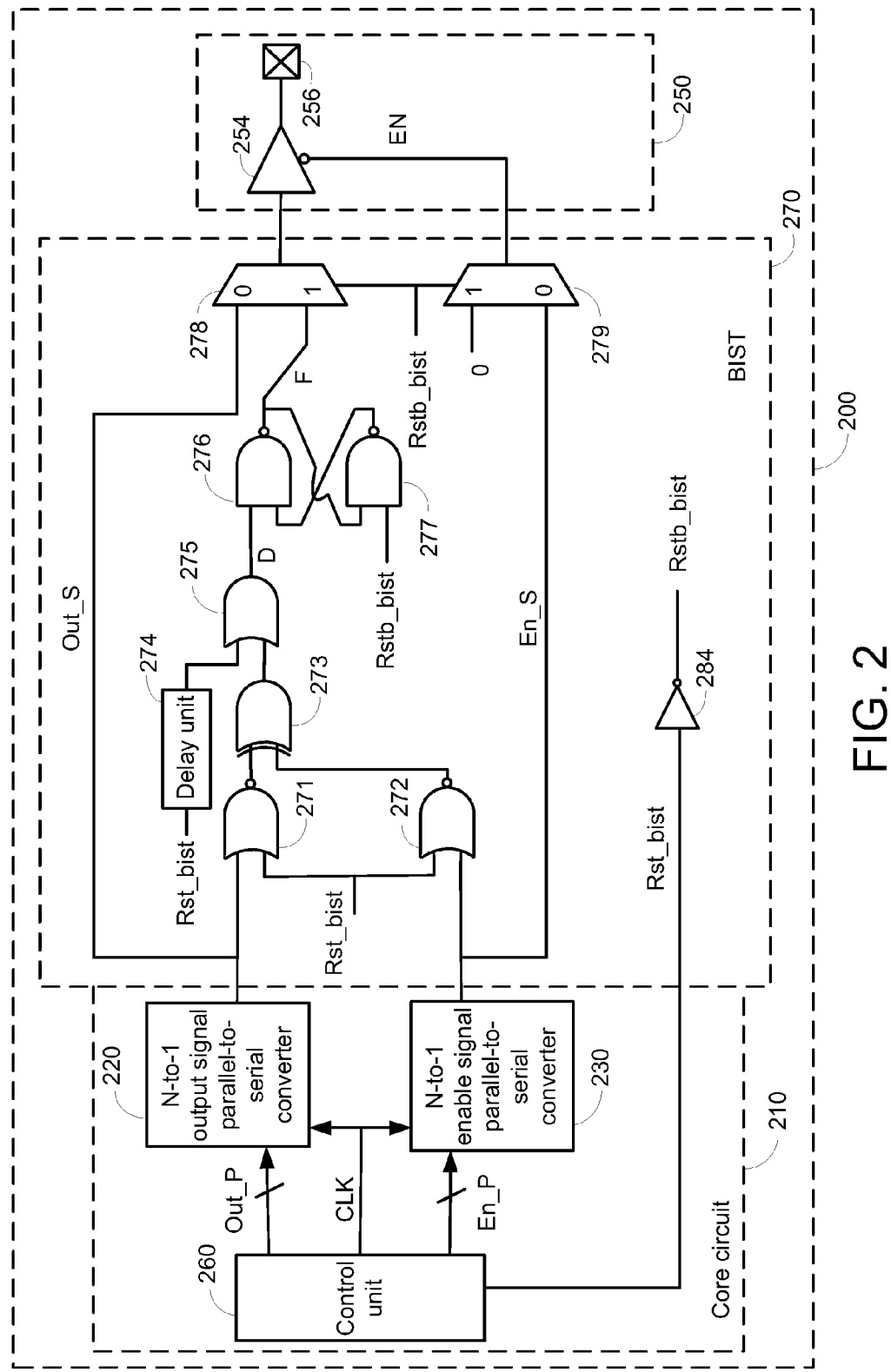
FIG. 2 is a BIST circuit and associated circuit in a memory controller according to one embodiment of the present invention.

FIG. 2 shows a memory controller 200 with a built-in self-test (BIST) circuit 270 according to one embodiment of the present invention. The memory controller 200 includes a core circuit 210, the BIST circuit 270 and an I/O port 250. The core circuit 210 includes a control unit 260, an N-to-1 output signal parallel-to-serial converter 220, and an N-to-1 enable signal parallel-to-signal converter 230. In this embodiment, the I/O port 250 is a one-directional I/O port, and includes an output driver 254 and an I/O pad 256. Alternatively, a bi-directional I/O port may be implemented in replacement of the one-directional I/O port as the I/O port 250. The control unit 260 outputs a reset signal Rst_bist to the BIST circuit 270 to indicate in a normal mode or a test mode.

The BIST circuit 270 includes a detecting unit, a flag unit and a selecting unit. The detecting unit includes a first NOR gate 271, a second NOR gate 272, an XOR gate 273, a delay unit 274 and an OR gate 275. The flag unit includes a first NAND gate 276 and a second NAND gate 277. The selecting unit includes a first multiplexer 278 and a second multiplexer 279. The BIST circuit 270 further includes a NOT gate 284 for converting the reset signal Rst_bist to an inverted reset signal Rstb_bist.

The detecting unit includes two input terminals and an output terminal. The input terminals are a first input terminal of the first NOR gate 271 and a first input terminal of the second NOR gate 272, and the output terminal is an output terminal of the OR gate 275. The first NOR gate 271 has the first input terminal connected to the N-to-1 output signal parallel-to-serial converter 220, and a second input terminal for receiving the reset signal Rst_bist. The second NOR gate 272 has the first input terminal connected to the N-to-1 enable signal parallel-to-serial converter 230, and a second input terminal for receiving the reset signal Rst_bist. The first NOR gate 271 and the second NOR gate 272 respectively have an output terminal connected to a second terminal of the XOR gate 273. The delay unit 274 receives the reset signal Rst_bist and outputs a delayed reset signal. The OR gate 275 has a first input terminal for receiving the delayed reset signal, and a second input terminal connected to an output terminal of the XOR gate 273 to generate a detection signal D.

In the flag unit, the first NAND gate 276 has a first input terminal for receiving the detection signal D. The second NAND gate 277 has a first input terminal for receiving the inverted reset signal Rstb_bist, a second input terminal connected to an output terminal of the NAND gate 276 to generate a flag signal F, and an output terminal connected to a second input terminal of the first NAND gate 276.

In the selecting unit, the first multiplexer 278 has a selecting terminal for receiving the inverted reset signal Rstb_bist, a 0 input terminal connected to the N-to-1 output signal parallel-to-serial converter 220, a 1 input terminal for receiving the flag signal F, and an output terminal connected to an input terminal of the output driver 254 in the I/O port 250. The second multiplexer 279 has a selecting terminal for receiving the inverted reset signal Rstb_bist, a 0 input terminal connected to the N-to-1 parallel-to-serial converter 230, a 1 input terminal for receiving a low-level signal "0", and an output terminal connected to an enable terminal EN of the output driver 254 in the I/O port 250.

In a normal mode, the control unit 260 outputs a high-level reset signal Rst_bist to the BIST circuit 270 to disable the detecting unit of the BIST circuit 270, and generates a high-level detection signal D. Due to the low level of the inverted reset signal Rstb_bist, the flag signal F of the flag unit is cleared to a low level. Further, the selecting unit respectively transmits the serial output signal Out_S and the serial enable signal En_S to the input terminal and the enable terminal EN of the output driver 254, and transmits the serial output signal Out_S to the I/O pad 256 according to a status of the serial enable signal En_S. Therefore, in the normal mode, the BIST circuit 270 is inactive, and operations of the memory controller 200 are same as those of a conventional memory controller.

In a test mode, the control unit 260 outputs a low-level reset signal Rst_bist to the BIST circuit 270, and utilizes to parallel output signal Out_P and the parallel enable signal En_P to output a test pattern. Due to the low level of the inverted reset signal Rstb_bist, the low-level signal "0" is transmitted to the enable terminal EN of the output driver 254 via the second multiplexer 279, and the flag signal F is transmitted to the output driver 254 via the first multiplexer 278 and is outputted at the I/O pad 256. When the memory controller 200 enters the test mode from the normal mode, the flag signal F is maintained at a low level. Further, by use of the delay unit 274, it is ensured that the detection signal D is maintained at a high level when entering the test mode from the normal mode.

In the test mode according to this embodiment, the parallel output signal Out_P and the parallel enable signal En_P are complementary. Taking N=4 for example, the parallel output signal Out_P sequentially outputs "1010", "0101", "1100" and "0011", and the parallel enable signal En_P sequentially outputs "0101", "1010", "0011", and "1100".

Given that the N-to-1 output signal parallel-to-serial converter 220 and the N-to-1 enable signal parallel-to-serial converter 230 are functional, a serial output signal Out_S of "1010010111000011" and a serial enable signal En_S of "0101101000111100" may be generated at a data speed in a GHz level. Therefore, an output signal of the XOR gate 273 is maintained at a high level, so that the detection signal D is also maintained at a high level whereas the signal F is maintained at a low level. After the control unit 260 has outputted the test patterns, when the flag signal F received by the test fixture at the I/O pad 256 is maintained at a low level, it means the memory controller 200 passes the test.

Conversely, when the N-to-1 output signal parallel-to-serial converter 220 and the N-to-1 enable signal parallel-to-serial converter 230 are not functional, at a specific time point in the test process, the serial output signal Out_S and the serial enable signal En_S have a same logic level. At this point, the output signal of the XOR gate 273 changes to a low level, such that the detection signal D changes to a low level and the flag signal F is then set to a high level. Therefore, during the test process, when the test fixture receives a high-level flag signal F at the I/O pad 256, it means the memory 200 fails the test.

In the test mode, once being set to a high level, the flag signal F of the flag unit cannot be changed back to a low level. Therefore, instead of reading the flag signal F at a same speed as that of the I/O port 250, the low speed tester is required to sample the flag signal F at the I/O pad 256.

It is known from the above embodiment that, in the test mode, the parallel output signal Out_P and the parallel enable signal En_P outputted by the control unit 260 have a complementary relationship. When the N-to-1 output signal parallel-to-serial converter 220 and the N-to-1 enable signal parallel-to-serial converter 230 are functional, the XOR gate 273 maintains the detection signal D at a high level, and the flag signal F is not set and remains at a low level. Conversely, when the N-to-1 output signal parallel-to-serial converter 220 and the N-to-1 enable signal parallel-to-serial converter 230 are not functional, the XOR gate 273 changes the logic level of the detection signal D such that the flag signal F is set to a high level.

It can be understood by a person skilled in the art that the XOR gate 273 may be replaced by an XNOR gate. Similar effects are achieved given that the test patterns (the parallel output signal Out_P and the parallel enable signal En_P) outputted by the control unit 260 are identical.

With the above embodiment, it is demonstrated that the BIST circuit 270 may be disposed in the memory device 200 to test the control unit 260, the N-to-1 output signal parallel-to-serial converter 220, and the N-to-1 enable signal parallel-to-serial converter 230. In the description below, a driving strength of an I/O port of a memory controller is detected by utilizing a BIST circuit of the disclosure.

Figure 3:
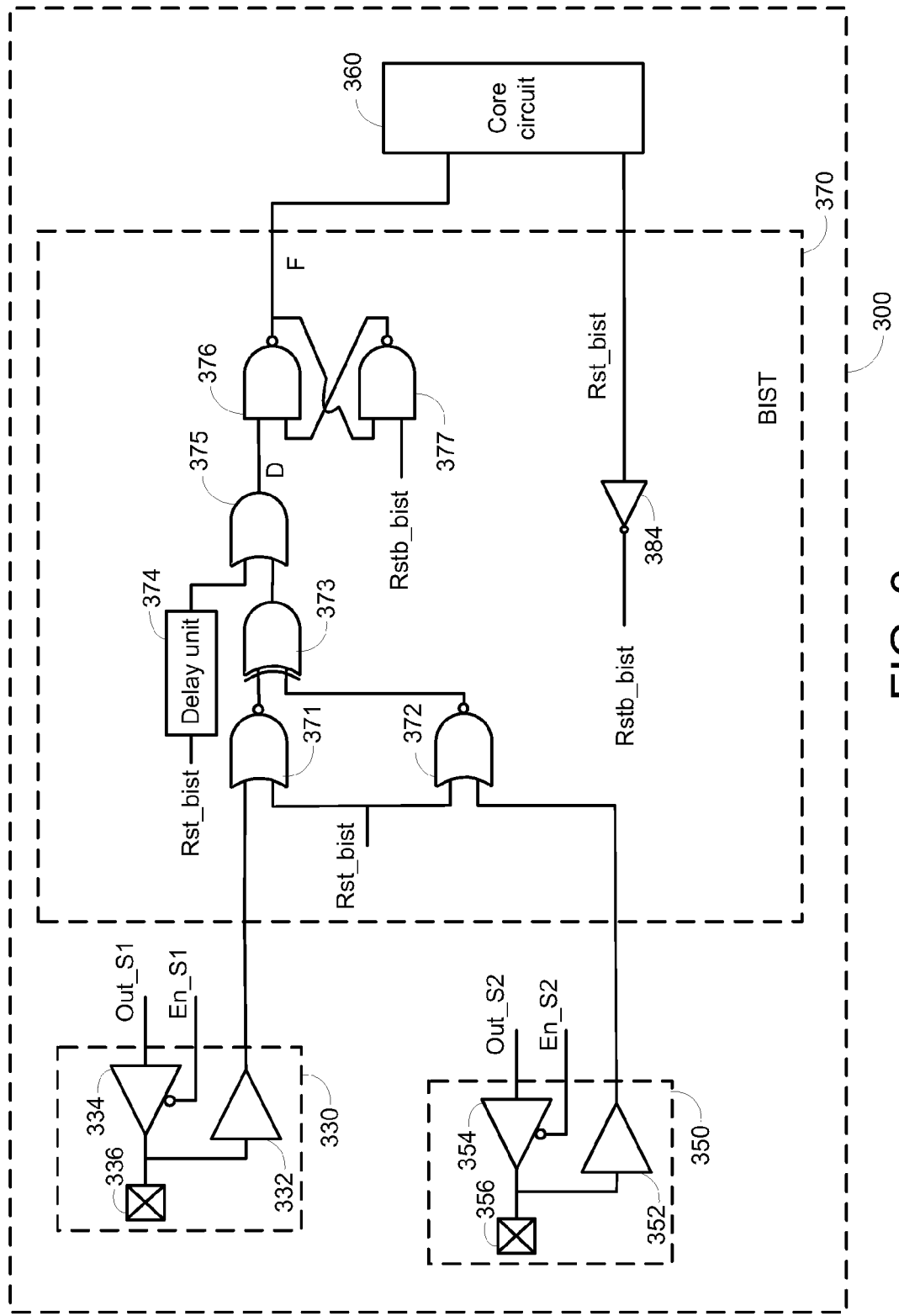
FIG. 3 is a BIST circuit and associated circuit in a memory controller according to an alternative embodiment of the present invention.

FIG. 3 a BIST circuit 370 and associated circuit in a memory controller 300 according to one embodiment of the present invention. The memory controller 300 includes a core circuit 360, the BIST circuit 370, a first I/O port 330 and a second I/O port 350. The first I/O port is 330 is a bi-directional I/O port, and includes an input driver 332, an output driver 334 and an I/O pad 336. The second I/O port 350 is a bi-directional I/O port, and includes an input driver 352, an output driver 354 and an I/O pad 356. The core circuit 360 transmits a first output signal Out_S1 and a first enable signal En_S1 to the first I/O port 330, and transmits a second output signal Out_S2 and a second enable signal En_S2 to the second I/O port 350.

The BIST circuit 370 includes a detecting unit and a flag unit. The detecting unit includes a first NOR gate 371, a second NOR gate 372, an XOR gate 373, a delay unit 374 and an OR gate 375. The detecting unit has two input terminals respectively connected to an output terminal of the input drivers 332 and 352. The flag unit includes a first NAND gate 376 and a second NAND gate 377. The BIST circuit 370 further includes an inverter 384 for converting a reset signal Rst_bist to an inverted reset signal Rstb_bist.

In a normal mode, the core circuit 360 outputs a high-level reset signal Rst_bist to the BIST circuit 370 to deactivate the detecting unit in the BIST circuit 370 and to generate a high-level detection signal D. A flag signal of the flag unit is cleared to a low-level.

In a test mode, the core circuit 360 outputs a low-level reset signal Rst_bist to the BIST circuit 370 to activate the BIST circuit 370. In this embodiment, the core circuit 360 utilizes the first enable signal En_S1 and the second enable signal En_S2 to enable the output driver 334 of the first I/O port 330 and the output driver 354 of the second I/O port 350. Meanwhile, the first output signal Out_S1 and the second output signal Out_S2 that are complementary are generated to serve as test patterns. For example, a GHz-level first output signal Out_S1 is "1010010111000011", and a GHz-level second output signal Out_S2 is "0101101000111100".

After the core circuit 360 has outputted the test patterns, when the flag signal F received by the core circuit 360 is maintained at a low level, it indicates the driving strengths of the output drivers 334 and 354 as well as the input drivers 332 and 352 in the first I/O port 330 and the second I/O port 350 are the same and pass the test.

Conversely, when the first I/O port 330 and the second I/O port 350 are not functional, at a specific time point in the test process, the first output signal Out_S1 and the second output signal Out_S2 have a same logic level. At this point, the output signal of the XOR gate 373 changes to a low level, such that the detection signal D changes to a low level and the flag signal F is set to a high level. Therefore, in the test process, when the core circuit receives a high-level flag signal F, it indicates that the memory controller 300 fails the test.

To sum up, the present invention discloses a BIST circuit applied to a high speed I/O port. Through the BIST circuit, a test result is generated at the I/O port by using a low speed and stable flag signal to allow a tester to read the flag signal and obtain the test result. Alternatively, the flag signal is provided to a control unit in a memory controller to indicate the test result.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A built-in self-test (BIST) circuit for a memory controller, the memory controller comprising a core circuit and an I/O port, the core circuit outputting a reset signal, a serial output signal and a serial enable signal, the I/O port comprising an output driver, the BIST circuit comprising:
    a detecting unit, having a first input terminal for receiving the serial output signal, a second input terminal for receiving the serial enable signal, and an output terminal for generating a detection signal
    a flag unit, for receiving the detection signal to generate a flag signal; and
    a selecting unit, for receiving the serial output signal, the serial enable signal and the flag signal;
    wherein, when the reset signal is at a first level, the selecting unit transmits the serial output signal and the serial enable signal to an input terminal and an enable terminal of the output driver, respectively; when the reset signal is at a second level, the serial output signal and the serial enable signal possesses a predetermined relationship, and the selecting unit transmits the flag signal to the input terminal of the output driver.

2. The BIST circuit according to claim 1, wherein before the serial output signal and the serial enable signal possesses a predetermined relationship, the detecting unit sets the flag signal in the flag unit.

3. The BIST circuit according to claim 1, wherein the selecting unit comprises:
    a first multiplexer, having a 0 input terminal for receiving the serial output signal, a 1 input terminal for receiving the flag signal, and a selecting terminal for receiving an inverted reset signal; and
    a second multiplexer, having a 0 input terminal for receiving the serial enable signal, a 1 input terminal for receiving a control signal, and a selecting terminal for receiving the inverted reset signal;

wherein, the first level of the reset signal is a high level, the second level of the reset signal is a low level, and the control signal is capable of enabling the output driver.

4. The BIST circuit according to claim 1, wherein the first level of the reset signal is a high level, the second level of the reset signal is a low level, and the predetermined relationship between the serial output signal and the serial enable signal is a complementary relationship.

5. The BIST circuit according to claim 4, wherein the detecting unit comprises:
   a first NOR gate, having a first input terminal for receiving the serial output signal, and a second input terminal for receiving the reset signal;
   a second NOR gate, having a first input terminal for receiving the serial enable signal, and a second input terminal for receiving the reset signal;
   an XOR gate, having two input terminals respectively connected to an output terminal of the first NOR gate and the second NOR gate;
   a delay unit, for receiving the reset signal and generating a delayed reset signal; and
   an OR gate, having a first input terminal for receiving the delayed reset signal, a second input terminal connected to the output terminal of the XOR gate, and an output terminal for generating the detection signal.

6. The BIST circuit according to claim 5, wherein the flag unit comprises:
   a first NAND gate, having a first input terminal for receiving the detection signal, a second input terminal and an output terminal for generating the flag signal; and
   a second NAND gate, having a first input terminal for receiving the inverted reset signal, a second input terminal connected to the output terminal of the first NAND gate, and an output terminal connected to the second input terminal of the first NAND gate.

7. The BIST circuit according to claim 1, wherein the core circuit comprises:
   a control unit, for outputting a parallel output signal and a parallel enable signal;
   an output signal parallel-to-serial converter, for receiving the parallel output signal and outputting the serial output signal; and
   an enable signal parallel-to-serial converter, for receiving the parallel enable signal and outputting the serial enable signal.

8. The BIST circuit according to claim 1, wherein the I/O port comprises:
   an I/O pad, connected to an output terminal of the output driver; and
   an input driver, having an input terminal connected to the I/O pad.

9. A BIST circuit for a memory controller, the memory controller comprising a core circuit, a first I/O port and a second I/O port, the core circuit outputting a reset signal, a first output signal and a second output signal, the first I/O port receiving the first output signal and outputting the output signal, the second I/O port receiving the second output signal and outputting the second output signal, the BIST circuit comprising:
   a detecting unit, having a first input terminal connected to the first I/O port to receive the first output signal, a second input terminal connected to the second I/O to receive the second output signal, and an output terminal for generating a detection signal; and
   a flag unit, for receiving the detection signal and generating a flag signal;
   wherein, when the reset signal is at a first level, the flag signal is cleared; when the reset signal is at a second level, the serial output signal and the serial enable signal possesses a predetermined relationship, and the detecting unit sets the flag signal in the flag unit before the predetermined relationship is present.

10. The BIST circuit according to claim 9, wherein the first level of the reset signal is a high level, the second level of the reset signal is a low level, and the predetermined relationship is a complementary relationship.

11. The BIST circuit according to claim 10, wherein the detecting unit comprises:
    a first NOR gate, having a first input terminal for receiving the serial output signal, and a second input terminal for receiving the reset signal;
    a second NOR gate, having a first input terminal for receiving the serial enable signal, and a second input terminal for receiving the reset signal;
    an XOR gate, having two input terminals respectively connected to an output terminal of the first NOR gate and the second NOR gate;
    a delay unit, for receiving the reset signal and generating a delayed reset signal; and
    an OR gate, having a first input terminal for receiving the delayed reset signal, a second input terminal connected to an output terminal of the XOR gate, and an output terminal for generating the detection signal.

12. The BIST circuit according to claim 11, wherein the flag unit comprises:
    a first NAND gate, having a first input terminal for receiving the detection signal, a second input terminal and an output terminal; and
    a second NAND gate, having a first input terminal for receiving the inverted reset signal, a second input terminal connected to the output terminal of the first NAND gate and for generating the flag signal, and an output terminal connected to the second input terminal of the first NAND gate.

13. The BIST circuit according to claim 9, wherein the first I/O port comprises:
    an output driver, having an input terminal for receiving the first output signal;
    an I/O pad, connected to an output terminal of the output driver; and
    an input driver, having an input terminal connected to the I/O pad to output the first output signal.

* * * * *